US005406277A

United States Patent [19]

Lee

[11] Patent Number: 5,406,277

[45] Date of Patent: Apr. 11, 1995

[54] STRUCTURE OF THE KEYPAD FOR KEYBOARD

[76] Inventor: Tony Lee, No. 2-5, Shan-Tzu-Pien Rd., Shui-Chien-Tou Tamsui, Taipei Hsien, Taiwan, Prov. of China

[21] Appl. No.: 45,113

[22] Filed: Apr. 12, 1993

[51] Int. Cl.[6] .......................... H03K 17/94; B41J 5/08

[52] U.S. Cl. ...................................... 341/22; 200/520; 400/490

[58] Field of Search .................................. 341/22, 34; 400/480–481, 490–495.1; 200/5 A, 520, 517

[56] References Cited

U.S. PATENT DOCUMENTS 4,227,163 10/1980 Barnoski .......................... 341/22 X
4,421,432 12/1983 Lieb ................................ 400/495 X
4,769,516 9/1988 Allen .............................. 200/5 A X
5,120,923 6/1992 Kato et al. .......................... 200/520
5,199,556 4/1993 Lee .................................. 200/520 X

*Primary Examiner*—John K. Peng
*Assistant Examiner*—Thomas J. Mullen, Jr.
*Attorney, Agent, or Firm*—Bacon & Thomas

[57] ABSTRACT

An improved keypad includes a plurality of apertured bases in the keyboard, a pressing rod and a keypad for each of the apertured bases. The pressing rod has opposing projected tracks and the apertured base has slots on its interior wall. This structure allows the pressing rod to be housed inside the apertured base so as to reduce the friction during the keypad operation. The reduction of friction provides a smooth keyboard operation. Moreover, the gap between the exterior wall of the pressing rod and the interior wall of the aperture base is wider, therefore, the keypad resonance is lessened during operation.

2 Claims, 4 Drawing Sheets

STRUCTURE OF THE KEYPAD FOR KEYBOARD

BACKGROUND OF THE INVENTION (a) Field Of the Invention

The present invention relates to an improvement of the structure of a keyboard. More specifically, the present invention relates to an improved keypad structure for keyboards with less friction to facilitate operation with a lower clicking noise.

(b) Description of the Prior Art

The conventional keypad in a keyboard has a poor structure. Operating friction between the movable part and the fixed part can cause a sticky keypad. Also the gap between the movable part and the fixed part must be tight to give a stable operation. But this can cause a resonance during operation of the keyboard. Moreover, the manufacturing of the components of the keyboards must be precise which can lead to a difficult and troublesome assembling.

SUMMARY OF THE INVENTION

The main object according to the present invention is to provide an improved structure of a keyboard to eliminate the operating friction as well as to give a stable and smooth operation.

Another object according to the present invention is to provide a keypad with less noise, in which the keypad has a wider gap between the keypad and its base to eliminate the resonance.

The foregoing objects of the present invention can be obtained by the structure of the keypad which includes an apertured base having opposing projected portions on its exterior wall. In an interior wall of the apertured base are slots which correspond to the positions of said projected portions. The shape of each slot is defined by three surfaces. The pressing rod is a cylindrical body having opposing smooth projected tracks in the longitudinal direction in its exterior wall. The projected tracks are slid into the slots in the interior wall of the aperture base when the pressing rod is placed into the apertured base. The surface of the smooth projected tracks contacts a portion the interior wall of a slot of said apertured base. During operation, the movement of the projected tracks of the pressing rod is not biased and is limited by the slots. Underneath the pressing rod are two compressed hook members having a certain degree of elasticity so as to limit the travel distance of the pressing rod. The compressing hook members also prevent the pressing rod from popping out when said keypad is not pressed down.

BRIEF DESCRIPTION OF THE DRAWINGS

The drawings disclose an illustrative embodiment of the present invention which serves to exemplify the various advantages and objects hereof, and are as follows.

DETAILED DESCRIPTION OF THE PREFERRED EMBODIMENT

Figure 1:
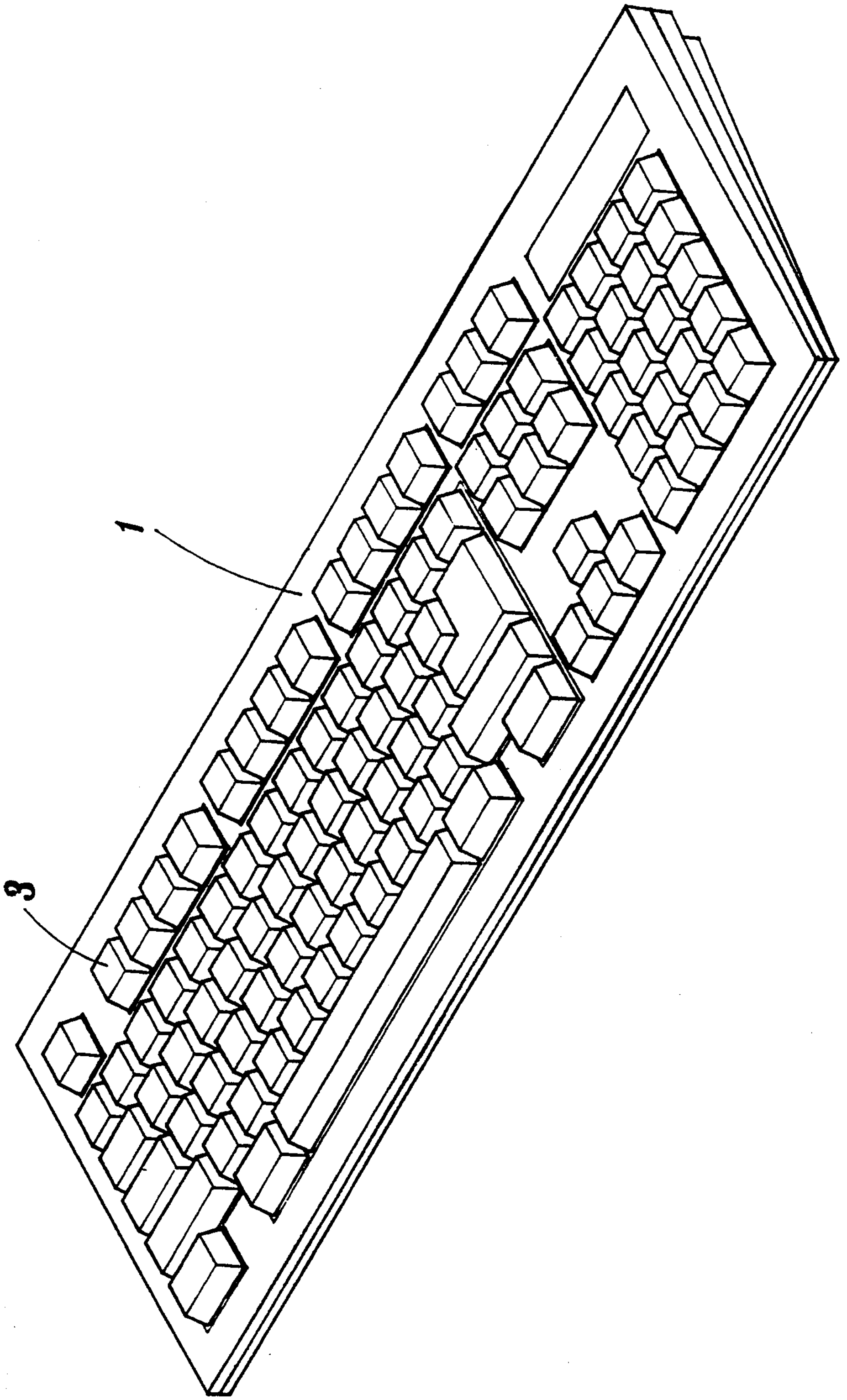
FIG. 1 is a perspective view of a keyboard body according to the present invention.
Figure 2:
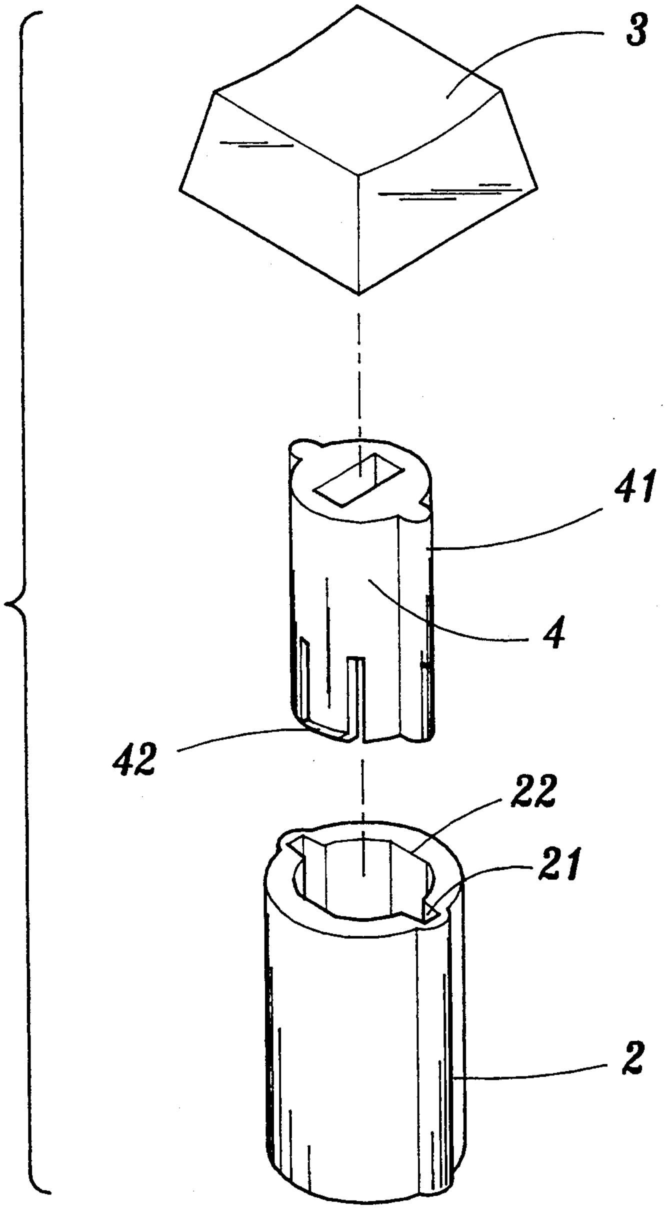
FIG. 2 is an exploded perspective view of a keypad according to the present invention.

Referring to FIG. 1, the perspective view of a keyboard body 1 according to the present invention includes a plurality of keypads 3, which are arranged in the keyboard body in the form of a general keyboard. The structure of the keypad apertured base according to the present invention is shown in FIG. 2 and comprises a cylindrical aperture forming a projected portion on the keyboard body. Each apertured base 2 can allow a cylindrical pressing rod 4 to fit in. On top of the pressing rod 4 is a keypad 3 which forms a keypad body, as shown in the perspective view of the disassembly. A cross sectional view of an assembly with the keypad 3, the pressing rod 4 and the apertured base 2 is shown in FIG. 3.

Figure 3:
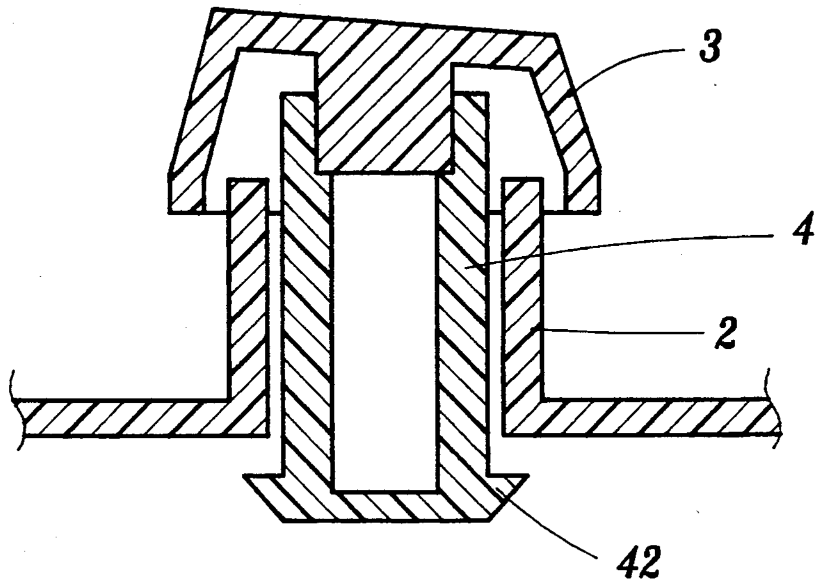
FIG. 3 is a cross sectional view of a keyboard integrated with the keypad according to the present invention.

Referring to FIG. 2, the bottom part of the keypad 3 fits into the top of the cylindrical pressing rod 4, which is housed in the apertured base 2, as shown in the cross sectional view of FIG. 3.

The structure of said pressing rod 4 is a cylindrical body having opposing smooth projected tracks 41 in the longitudinal direction on its exterior wall. The projected tracks 41 are slid into slots 21 in the interior wall of the apertured base 2. After the assembling of the pressing rod 4 into the apertured base 2, the projected tracks 41 of the pressing rod 4 are located in the slots of the apertured base 2, therefore, the keypad will not rotate or bias its position but it can smoothly move up and down.

Figure 4:
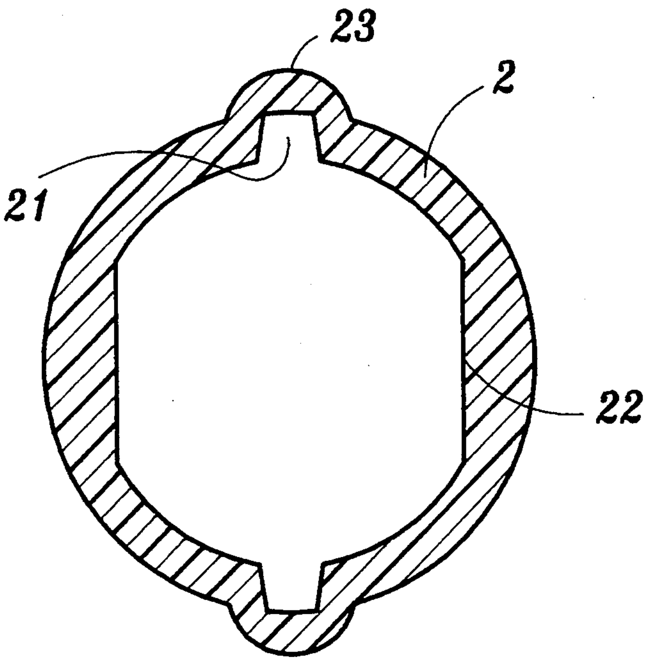
FIG. 4 is a top view illustrating the relationship between the circular pressing rod and the keypad aperture base according to the present invention.

FIG. 4 is a top view of the apertured base 2. This view shows a circular aperture having opposing smooth projected portions 23 on its exterior wall in the longitudinal direction. In the interior wall of the apertured base 2 are slots 21 which correspond to the positions of said smooth projected portions 23. The shape of each slot 21 is defined by three surfaces, as is shown in FIG. 4. When a pressing rod 4 is slid into an apertured base 2, the opposing projected tracks 41 of the pressing rod 4 have a limited contact with the apertured base 2. The surface of the pressing rod and the surface of the apertured base do not come in contact with each other. This eliminates the operating friction and provides a smoother movement of the pressing rod. Moreover, the outside diameter of the pressing rod 4 does not need to be fabricated to precisely fit into the apertured base 2. The problem of precision fabrication for the pressing rod 4 in a conventional technology is thus resolved. In addition, the gap between the exterior wall of the pressing rod 4 and the interior wall of the aperture base is wider, therefore, the resonance caused by keyboard operation is lessened.

The travel distance of the pressing rod 4 is limited by a compressed hook member 42 which is underneath the pressing rod 4. The compressed hook member 42 prevents the pressing rod 4 from popping out when the keypad is not pressed down.

The compressed hook member 42, having a certain degree of elasticity, is formed together with the pressing rod 4. Therefore, the assembling of the keypad is done simply by putting together the pressing rod 4 into the apertured base 2. The interior walls of the apertured base 2 have two interior flat surfaces 22 which are displaced from the slots 21. The purpose of said interior flat surfaces 22 is to provide a clamping surface for the compressed hook member 42 when the pressing rod 4 is placed into the apertured base 2. This prevents the pressing rod 4 from separating from the apertured base 2 when the keypad 3 is not pressed down, as is shown in FIG. 3. A contact is made underneath the pressing rod 4 when it is pressed down so as to transmit the electrical signal. It is similar to the conventional technology and therefore is not described here.

The foregoing description of the preferred embodiment of the invention has been presented for the purpose of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An improved keypad structure for a keyboard comprising an apertured base, a pressing rod and a keypad mounted on the pressing rod, wherein the apertured base is cylindrical in shape having opposing smooth portions projecting from its exterior and extending in a longitudinal direction, the apertured base having an interior wall defining elongated slots located adjacent to said smooth portions, the shape of each elongated slot being defined by three surfaces;

said pressing rod comprises a cylindrical body having opposing smooth tracks projecting from its exterior and extending in a longitudinal direction, the tracks configured to slide into the elongated slots defined by the interior wall of the apertured base when the pressing rod is placed into said apertured base, such that the respective surfaces of the smooth tracks contact a portion of the respective elongated slots defined by the interior wall of said apertured base, whereby during operation of the keypad structure the movement of the tracks in the elongated slots prevents the pressing rod from becoming misaligned in the apertured base; and two elastic hook members are located on the pressing rod and engage the apertured base, so as to limit the travel distance of said pressing rod relative to the apertured base and to prevent removal of the pressing rod from the apertured base when said keypad is not pressed down.

2. An improved keypad structure for a keyboard as claimed in claim 1 wherein the interior wall of the apertured base further defines two interior flat surfaces displaced from said elongated slots, said interior flat surfaces providing clamping surfaces for engagement with the elastic hook members when the pressing rod is placed into the apertured base.

* * * * *